United States Patent [19]
Holler, Jr. et al.

[11] Patent Number: 5,416,446
[45] Date of Patent: May 16, 1995

[54] DIGITAL PROGRAMMABLE FREQUENCY GENERATOR

[75] Inventors: Paul T. Holler, Jr.; Hyun Lee, both of Allentown, Pa.

[73] Assignee: AT&T Corp., Murray Hill, N.J.

[21] Appl. No.: 987,917

[22] Filed: Dec. 8, 1992

[51] Int. Cl.⁶ .............................................. H03B 5/24
[52] U.S. Cl. ........................... 331/57; 331/1 A; 331/25; 331/34; 327/114
[58] Field of Search .............. 331/1 A, 34, 57, 25

[56] References Cited

U.S. PATENT DOCUMENTS

| | | |
|---|---|---|
| 3,287,655 | 11/1966 | Venn et al. |
| 3,931,588 | 1/1976 | Gehweiler ............................. 331/57 |
| 4,346,343 | 8/1982 | Berndlmaier et al. .............. 323/282 |
| 4,906,944 | 3/1990 | Frerking ............................. 331/1 A |
| 4,988,960 | 1/1991 | Tomisawa ............................ 331/57 |
| 5,012,141 | 4/1991 | Tomisawa ............................ 307/594 |
| 5,072,197 | 12/1991 | Anderson ............................. 331/57 |
| 5,121,014 | 6/1992 | Huang ................................ 307/605 |
| 5,206,609 | 4/1993 | Mijuskovic ........................ 331/57 |
| 5,220,216 | 6/1993 | Woo .................................... 307/469 |
| 5,233,316 | 8/1993 | Yamada et al. ...................... 331/49 |

FOREIGN PATENT DOCUMENTS

WO88/08642 11/1988 WIPO ........................... H03K 5/13

OTHER PUBLICATIONS

European Search Report dated Dec. 2, 1994.

*Primary Examiner*—Robert J. Pascal
*Assistant Examiner*—Arnold Kinkead
*Attorney, Agent, or Firm*—James H. Fox

[57] ABSTRACT

Frequency generators that may be programmed are utilized in a wide variety of applications. Typical applications include radio and television receivers and transmitters, and computer devices that must operate at different clock rates, or be compatible with systems that operate at different clock rates. The present technique provides for programmably generating a frequency. A ring oscillator receives at least one operating voltage through a programmable array of field effect transistors. Digitally selecting a given set of the transistors provides a given operating current for the ring, which establishes the frequency of operation. In one embodiment, the technique is implemented in a CMOS integrated circuit. This technique provides for more rapid frequency changes in a low-power circuit than can be obtained with typical prior-art techniques (e.g., a phase-locked loop).

13 Claims, 2 Drawing Sheets

DIGITAL PROGRAMMABLE FREQUENCY GENERATOR

BACKGROUND OF THE INVENTION

1. Field of the Invention

The present invention relates to a digital programmable frequency generator.

2. Description of the Prior Art

Frequency generators that may be programmed are utilized in a wide variety of applications. Typical applications include radio and television receivers and transmitters, and computer devices that must operate at different clock rates, or be compatible with systems that operate at different clock rates. A typical prior-art technique for implementing a programmable frequency generator is the use of a phase-locked loop (PLL). The PLL includes a voltage-con,oiled oscillator (VCO), phase comparator, and programmable counter that are arranged in a well-known configuration. By changing the count of the counter, a desired frequency division ratio can be achieved that produces the desired output frequency from the VCO. However, a PLL has an inherent limitation as to the speed that a change in frequency can be made, which is dependent on the loop characteristics and the magnitude of the change. Furthermore, typical PLL implementations require significant power to operate, and their analog nature makes them susceptible to noise problems. In addition, many PLL designs are not readily adapted to low-voltage operation, as may. occur, for example, in battery-operated potable systems where 3 volt (or less) operation is becoming common.

One technique for overcoming some of the PLL limitations is direct digital synthesis (DDS). In that technique, a digital representation of an analog waveform, for example a sinusold, is stored in read-only memory. By repetitively reading out the memory at a given ram, and applying the digital waveform to a digital-to-analog converter, an analog waveform at the desired frequency is obtained. The DDS technique typically allows for relatively rapid changes in frequency. However, DDS is overly complicated for many applications, as when only a binary clock waveform is needed, for example. It also may not lend itself to low-voltage, low-power applications. Another approach that is more oriented to digital technology involves the use of a ring oscillator with multiple inverter stages. The number of active stages is changed, in order to change the frequency of oscillation. However, that may require a large number of inverter stages to obtain a wide frequency range, especially if relatively small steps in frequency are required over the range.

SUMMARY OF THE INVENTION

We have invented a technique for programmably generating a frequency. A ring oscillator receives at least one operating voltage through a programmable array of field effect transistors. Digitally selecting a given set of the transistors provides a given operating current for the ring, which establishes the frequency of operation. In one embodiment, the technique is implemented in a CMOS integrated circuit.

DETAILED DESCRIPTION

The following detailed description relates to a programmable frequency generator (PFG). The PFG may be used to produce a highly accurate variable frequency system clock. For example, in one design implemented in CMOS technology, the frequency ranges from 400 kHz to 100 MHz, while using a single inexpensive crystal oscillator as a reference. Both the frequency and tolerance of the PFG can be programmed by the user. Power consumption is of concern in many systems, especially portable battery-operated systems. Two methods that can be used to minimize system power are to deactivate the system when not in use, and to vary the clock rate to match the work load or application. The PFG described herein meets both of these objectives. The PFG can stop the clock in a known state when the system is idle. It also can produce a variable frequency system clock in line with various applications, such as compute-intensive applications, interactive user data-entry mode, etc. The PFG may switch its output frequency rapidly (e.g., in less than 150 microseconds in the illustrative embodiment), without stopping the output.

Figure 1:
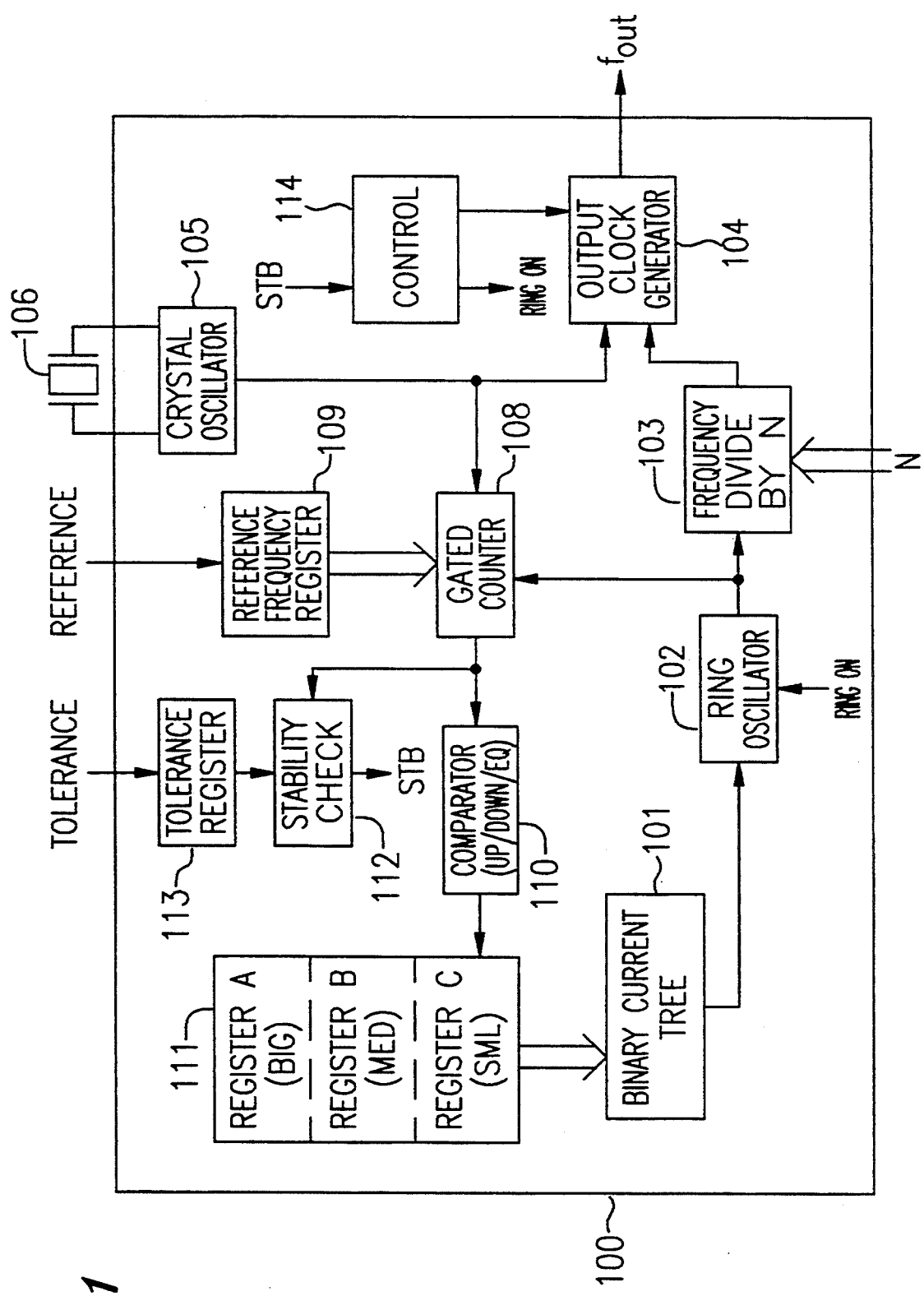
FIG. 1 shows a block diagram of a clock generator that advantageously uses the present technique.

Referring to FIG. 1, a block diagram of a typical system utilizing the present invention is shown. While the overall organization of this system is otherwise similar to those known in the art, it will be seen that the binary current tree 101, ring oscillator 102, and ring frequency registers 111 provides for a unique design and method of operation, as described below. The PFG can be used as a stand-alone integrated circuit chip, or implemented as a macro cell in a microprocessor or system management device. The PFG can be understood with reference to five major functional areas: a ring oscillator and binary current tree, frequency controller, frequency divider, output clock generator, and control logic. In the implementation shown, inputs are provided for programming the reference frequency register 109 and frequency divider stage 103, while two bond pads provide for connection to an external crystal 106.

Figure 2:
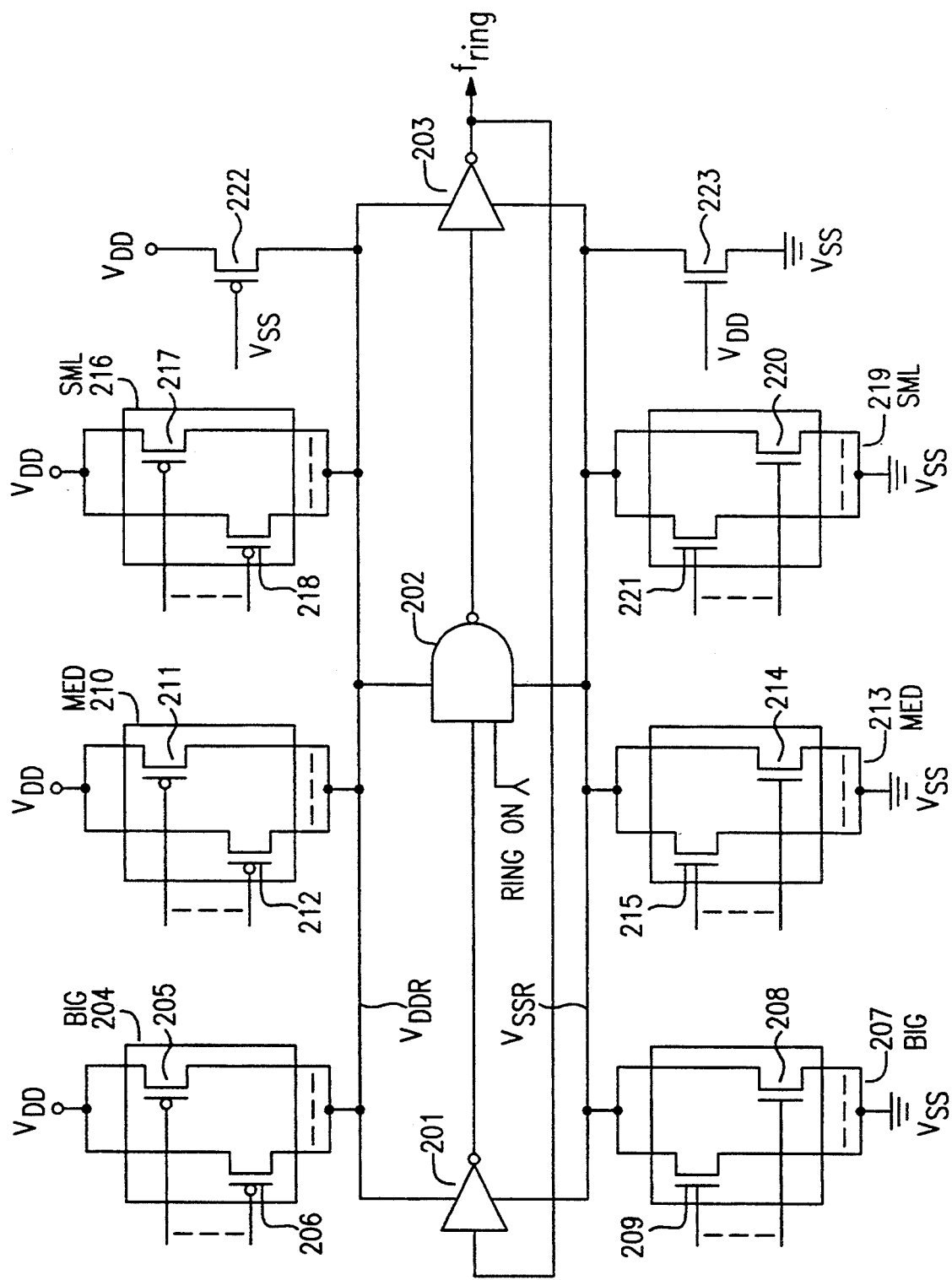
FIG. 2 shows a ring oscillator implementing the inventive technique.

A description of each functional area follows:

Ring Oscillator and Binary Current Tree:

The core of the PFG is a binary current tree 101 and a ring oscillator 102, which employs a digital frequency feedback loop to generate a stabilized output at the specified frequency. Referring to FIG. 2, the ring oscillator includes a ring of an odd number of inverters 201, 202, and 203, considering that NAND gate 202 performs an inversion when RING ON is high. These inverters receive positive ($V_{DDR}$) and negative ($V_{SSR}$) power supply voltages through the binary current tree, which is voltage controlled in the illustrative case. This current tree includes PMOS and NMOS transistor networks, each arranged in three banks (204, 210, 216, and 207, 213, 219, respectively). The PMOS and NMOS transistor networks limit current to the ring and thereby control the delay through each inverter. This in turn alters the frequency in the following manner: when all the transistors in the binary current tree are on (conducting), the frequency of oscillation of the ring oscillator is maximum. When a given pair of p-channel and n-channel transistors is turned off (non-conducting), the power supply current to the ring is thereby reduced, which reduces the frequency of oscillation. If all the controlled transistors are turned off, a minimum frequency of operation is maintained by current through transistors 222 and 223. The ring may be turned on or off by the RING ON signal (from control logic 114) applied to NAND gate 202. This allows, for example, retaining the crystal oscillator on while disabling the ring oscillator in order to save power.

Each pair of banks is tuned so that the oscillator frequency changes in uniform steps when turning on/off transistor pairs within a pair of banks. For example, applying a low voltage to the gate of transistor 205 while simultaneously applying a high voltage to the gate of transistor 208 turns on that pair, allowing power supply current conduction therethrough to the ring oscillator. The low and high gate voltages may be $V_{SS}$ and $V_{DD}$. Alternatively, a wider range of the ring oscillator frequency may be obtained by using $V_{SS}$ and $V_{DD}$ for the low and high voltages on the gates of the transistors in the binary current tree. The transistor sizes in the banks are designed to give varying sized steps (small, medium and large), with overlap between banks to ensure frequency convergence. In the illustrative case, the BIG and SML banks (204, 207, 216 and 219) each have 16 transistors, whereas the MED banks (210 and 213) each have 20 transistors. Overlap in frequency may be obtained by sizing the transistors such that the current supplied by one BIG transistor pair is equal to the current supplied by less than all of the MED transistor pairs. For example, in the illustrative case the current produced by a BIG transistor pair is equal to the current provided by 16 MED transistor pairs.

The transistors in the banks are controlled by the ring frequency registers 111 according to signals generated by the comparator 110. In particular, the REGISTER A provides the control signals to the gates of the transistors in banks 204 and 207, whereas REGISTERS B and C similarly control the other banks as indicated in FIG. 1. The number of "on" transistor pairs is increased/decreased by one, or alternatively unchanged, during each evaluation of the ring frequency. The ring oscillator frequency is sampled and periodically adjusted; e.g., every 1 to 2 microseconds in the illustrative case.

The advantages of the above approach over the conventional method are:

1) There is no wasted power due to current mirrors, as typically occurs when generating a bias voltage for the ring oscillator in conventional PLL designs.

2) There are no noise problems which are associated with analog feedback.

3) This method allows low voltage operation which might be more difficult in an analog scheme.

4) Unlike the PLL approach, the operating frequency can be changed quickly.

Frequency Controller:

The frequency controller comprises the reference frequency generator, being crystal oscillator 105, the gated counter 108, the reference frequency register 109, the comparator 110, the ring frequency registers 111, and the stability checker 112. The frequency controller serves to measures the frequency of the ring oscillator, and send the appropriate control signals to the binary current tree to obtain (or maintain) the desired ring oscillator frequency. To accomplish this, the gated counter 108 counts the number of cycles of the ring oscillator during a known interval, which is a function of the crystal 106 connected to the crystal oscillator 105. The gated counter is pre-loaded with the one's complement of the desired count from the reference frequency register 109. The counter then counts up during the sampling interval. The value of the counter is inspected by the comparator 110 to determine whether the ring frequency should be changed and in what direction (faster or slower). For this purpose, comparator 110 provides "up", "down", and "equal" signal outputs to the ring frequency registers 111.

In addition, the stability checker 112 monitors the magnitude of the difference between the set frequency and the actual frequency. This difference is used to determine whether the ring oscillator is stable and within the desired tolerance (e.g., from 0.5% to 4% in the illustrative case), as programmed into the tolerance register 113. The tolerance/stability check circuit may be used to adapt the PFG to environmental conditions and specifications. For example, if the usage is in a high-noise system, the tolerance can be increased in value (i.e., loosened). The frequency of the ring oscillator is influenced by the programmed tolerance. For example, a looser tolerance (less accuracy) requirement allows for a lower ROSC frequency ($f_{ring}$), which reduces power dissipation. The stability checker sends a signal STB to the control logic 114 when the ring oscillator is stable. If a change in ring frequency is required such that a large step size transistor must be turned on/off, the stable signal is dropped to prevent any large variation in ring frequency from propagating to the output.

Frequency Divider:

The divide-by-N frequency divider 103 divides the ring oscillator output down to a lower frequency. The frequency divider 103 is typically designed so that the programmable frequency output is step-wise continuous over the entire programmable range. That is, the frequency output is quantized (for example, in steps of approximately 0.5%) over the output frequency range (for example, 20 kHz to 100 MHz). The divider 103 in the illustrative case consists of a divide by 2-or-3 followed by a chain of divide-by-2 blocks. To minimize power dissipation, the divide-by-2 chain may be a ripple counter and unneeded portions of the chain (higher order bits) are inactive. To program a desired frequency, the frequency divider 103 and reference frequency register 109 are provided with values as follows:

$$N = \frac{f_{out}}{f_{ring}},$$

where $f_{out}$ is the desired output frequency, and $f_{ring}$ is the frequency of the ring oscillator necessary to obtain the desired output frequency. In the illustrative case, $N = (2$ or $3) \times 2^L$, where L typically ranges from 0 to 6.

$$\text{reference frequency register} = f_{ring} \times \frac{K}{f_{ref}}$$

where K is a fixed value depending on the implementation (K=7 in the illustrative case), and $f_{ref}$ is the frequency of the crystal oscillator 105.

Output Clock Generator:

The output clock generator 104 receives source selection information from the control logic 114 and input clock sources from the crystal oscillator and the frequency divider. It includes an input multiplexer and output formatter (not shown). The input multiplexer is designed to allow the output frequency to be switched without a glitch. To switch from the crystal oscillator 105 to the frequency divider 103, the multiplexer control signal disables the crystal oscillator signal path and enables the frequency divider path after 2 clock cycles from the frequency divider. A complementary sequence occurs when switching from the frequency divider to the crystal oscillator. The formatter is able to produce variously formatted clock outputs (e.g., 2-phase, 4-phase, etc.) In addition, this block halts the output in a predetermined state. This corresponds to the very low power stopped clock mode.

Control Logic:

The control logic 114 continuously monitors the signals within the PFG as well as the input control signals. In the power-up mode, the output clock generator 104 is instructed to use the crystal oscillator 105 as the clock. When the PFG register is updated, the control logic checks to see if the ring oscillator is required for operation. If so, the ring is turned on and the control logic waits for the frequency controller to set the stability check signal. While waiting for the stability signal to be set, the output clock generation may continue using the crystal oscillator as the source clock. When stability is achieved, the output clock generator is instructed to use the output of the frequency divider 103 as the clock source. If the control logic senses loss of stability, it instructs the output clock generator to use the crystal oscillator clock until the frequency controller once again determines that stability is achieved.

While the system shown in FIG. 1 is illustrative of a clock generator, the binary-controlled ring oscillator as shown illustratively in FIG. 2 may be used in a variety of other applications, as will be apparent to persons of skill in the art. The number of stages in the ring oscillator, and the number and grouping of transistors in the binary current tree may differ from those shown herein. Various implementations of the digital feedback loop are possible. However, the present technique may be used in applications that do not require a feedback loop nor reference frequency. Furthermore, while the above embodiment has been illustrated in CMOS technology, other technologies are possible. For example, a single conductivity type of transistor may be used to control the current flow from only a single power supply voltage, allowing for designs with only n-channel transistors in NMOS technology, or alternatively only p-channel transistors in PMOS technology, for example. Applications in bipolar technologies, including those that implement GaAs and various other device types, are also possible and included herein. In the bipolar case, the binary current tree is typically current controlled, rather than voltage controlled.

We claim:

1. An integrated circuit comprising a ring oscillator that includes inverters having positive and negative power supply nodes coupled to positive and negative power supply voltage conductors, respectively, characterized in that the positive power supply nodes of the inverters are connected together; the negative power supply nodes of the inverters are connected together; and at least one of said positive and negative power supply nodes of said inverters are connected to the respective power supply voltage conductor through a multiplicity of transistors arranged in at least two banks, with each of said banks having at least two transistors having controlled terminals connected in parallel, and wherein the transistors in a first of said banks have a first size, and the transistors in a second of said banks have a second size that is different than said first size; and further comprising a frequency controller for comparing the frequency of said ring oscillator to a reference frequency for providing binary control signals to the control terminals of said transistors to vary their conductivity between a conducting and non-conducting state, whereby the frequency of oscillation of said ring oscillator may be controlled.

2. The integrated circuit of claim 1 wherein a first multiplicity of transistors connects said positive power supply nodes to the positive power supply voltage conductor, and a second multiplicity of transistors connects said negative power supply nodes to the negative power supply voltage conductor.

3. The integrated circuit of claim 2 wherein said first multiplicity of transistors are p-channel field effect transistors and said second multiplicity of transistors are n-channel field effect transistors.

4. A system for programmably generating a range of frequencies, said system including a power supply that provides positive and negative voltages, and an integrated circuit comprising a ring oscillator that includes inverters having positive and negative power supply nodes coupled to positive and negative power supply voltage conductors, respectively, characterized in that the positive power supply nodes of the inverters are connected together; the negative power supply nodes of the inverters are connected together; and at least one of said positive and negative power supply nodes of said inverters are connected to at least one of said power supply voltage conductors through a multiplicity of transistors arranged in at least two banks, with each of said banks having at least two transistors having controlled terminals connected in parallel, and wherein the transistors in a first of said banks have a first size, and the transistors in a second of said banks have a second size that is different than said first size; and further comprising a frequency controller for comparing the frequency of said ring oscillator to a reference frequency for providing binary control signals to the control terminals of said transistors to vary their conductivity between a conducting and non-conducting state, whereby the frequency of oscillation of said ring oscillator may be controlled.

5. The system of claim 4 wherein a first multiplicity of transistors connects said positive power supply nodes to the positive power supply voltage conductor, and a second multiplicity of transistors connects said negative power supply nodes to the negative power supply voltage conductor.

6. The system of claim 5 wherein said first multiplicity of transistors are p-channel field effect transistors and said second multiplicity of transistors are n-channel field effect transistors.

7. The system of claim 4 wherein said means for supplying a reference frequency includes a crystal that is external to said integrated circuit.

8. The integrated circuit of claim 2 wherein said binary control signals are the voltages on said positive and negative power supply voltage conductors.

9. The integrated circuit of claim 2 wherein said binary control signals are the voltages on said positive and negative power supply nodes.

10. The system of claim 5 wherein said binary control signals are the voltages on said positive and negative power supply voltage conductors.

11. The system of claim 5 wherein said binary control signals are the voltages on said positive and negative power supply nodes.

12. The integrated circuit of claim 1 wherein said frequency controller comprises a gated counter which counts the number of cycles of the ring oscillator during an interval that is a function of the reference frequency.

13. The system of claim 4 wherein said frequency controller comprises a gated counter which counts the number of cycles of the ring oscillator during an interval that is a function of the reference frequency.

* * * * *